(12) United States Patent
Ko et al.

(10) Patent No.: US 11,296,297 B2
(45) Date of Patent: Apr. 5, 2022

(54) DISPLAY DEVICE HAVING AN INORGANIC LAYER COVERING AN END OF A FIRST ELECTRODE

(71) Applicant: SAMSUNG DISPLAY CO., LTD., Yongin-si (KR)

(72) Inventors: Gun Woo Ko, Seoul (KR); Chan Young Kim, Hwaseong-si (KR); Jung Tae Park, Incheon (KR); Yeong Ho Lee, Hwaseong-si (KR); Seong Min Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/878,761

(22) Filed: May 20, 2020

(65) Prior Publication Data

US 2021/0066639 A1 Mar. 4, 2021

(30) Foreign Application Priority Data

Sep. 4, 2019 (KR) ........................ 10-2019-0109444

(51) Int. Cl.
*H01L 29/08* (2006.01)
*H01L 51/52* (2006.01)
*H01L 27/32* (2006.01)

(52) U.S. Cl.
CPC ...... *H01L 51/5203* (2013.01); *H01L 27/3258* (2013.01); *H01L 27/3262* (2013.01); *H01L 27/3265* (2013.01); *H01L 2251/303* (2013.01)

(58) Field of Classification Search
CPC ............. H01L 51/5203; H01L 51/5275; H01L 27/3258; H01L 27/3262; H01L 2251/303
See application file for complete search history.

(56) References Cited

U.S. PATENT DOCUMENTS

| | | | | |
|---|---|---|---|---|
| 2005/0266763 A1* | 12/2005 | Kimura | ............... | H01L 51/0005 445/24 |
| 2005/0285509 A1* | 12/2005 | Funamoto | ........... | H01L 51/5275 313/504 |
| 2015/0303402 A1* | 10/2015 | Yoshikawa | ......... | H01L 27/3202 257/40 |
| 2018/0088293 A1 | 3/2018 | Toyonaka et al. | | |
| 2019/0386066 A1* | 12/2019 | Cai | ......................... | H01L 21/77 |

FOREIGN PATENT DOCUMENTS

| | | |
|---|---|---|
| KR | 10-0735978 | 6/2007 |
| KR | 10-2015-0069805 | 6/2015 |
| KR | 10-2015-0108477 | 9/2015 |
| KR | 10-2016-0052859 | 5/2016 |
| KR | 10-2017-0032954 | 3/2017 |

* cited by examiner

*Primary Examiner* — Phuc T Dang
(74) *Attorney, Agent, or Firm* — F. Chau & Associates, LLC

(57) ABSTRACT

A display device includes: a first electrode; a second electrode overlapping the first electrode; a light emission layer disposed between the first electrode and the second electrode; a partition wall overlapping a portion of the first electrode; and an inorganic layer disposed between the partition wall and the first electrode, wherein the inorganic layer covers an end of the first electrode.

19 Claims, 12 Drawing Sheets

US 11,296,297 B2

DISPLAY DEVICE HAVING AN INORGANIC LAYER COVERING AN END OF A FIRST ELECTRODE

CROSS-REFERENCE TO RELATED APPLICATION

This application claims priority under 35 U.S.C. § 119 to and the benefit of Korean Patent Application No. 10-2019-0109444 filed in the Korean Intellectual Property Office on Sep. 4, 2019, the disclosure of which is incorporated by reference herein in its entirety.

TECHNICAL FIELD

The present invention relates to a display device, and more particularly to a display device including a first electrode and an inorganic layer on the first electrode.

DISCUSSION OF THE RELATED ART

Generally, a display device includes two electrodes and a light emission layer disposed therebetween. An electron injected from a cathode, which is one electrode, and a hole injected from an anode, which is the other electrode, are coupled with each other in the light emission layer to generate an exciton. The exciton emits light while releasing energy.

The display device includes a plurality of pixels, each of which include a light emitting diode including the cathode, the anode, and the light emission layer therebetween. Each pixel includes a transistor and a capacitor for driving the light emitting diode.

SUMMARY

According to an exemplary embodiment of the present invention, a display device includes: a first electrode; a second electrode overlapping the first electrode; a light emission layer disposed between the first electrode and the second electrode; a partition wall overlapping a portion of the first electrode; and an inorganic layer disposed between the partition wall and the first electrode, wherein the inorganic layer covers an end of the first electrode.

In an exemplary embodiment of the present invention, the light emission layer is surrounded by the first electrode, the inorganic layer, and the second electrode.

In an exemplary embodiment of the present invention, a side surface of the light emission layer contacts a side surface of the inorganic layer.

In an exemplary embodiment of the present invention, the light emission layer has a thickness of about 2000 angstroms to about 4000 angstroms.

In an exemplary embodiment of the present invention, the inorganic layer has a thickness of about 50 angstroms to about 5000 angstroms.

In an exemplary embodiment of the present invention, the inorganic layer includes at least one of a silicon oxide, a silicon oxynitride, or a silicon nitride.

In an exemplary embodiment of the present invention, the inorganic layer is in contact with the second electrode.

In an exemplary embodiment of the present invention, the display device further includes: a transistor disposed on a substrate; and an insulating layer disposed on the transistor, wherein the second electrode is in contact with the insulating layer.

According to an exemplary embodiment of the present invention, a display device includes: a transistor disposed on a substrate; an insulating layer disposed on the transistor; a first electrode disposed on the insulating layer and electrically connected to the transistor; a second electrode overlapping the first electrode; a light emission layer disposed between the first electrode and the second electrode; and an inorganic layer disposed between the first electrode and the second electrode, wherein the inorganic layer contacts the light emission layer and covers an end of the first electrode.

In an exemplary embodiment of the present invention, the second electrode includes a first area overlapping the first electrode and a second area corresponding to a remaining portion, and a distance from an upper surface of the substrate to an upper surface of the first area of the second electrode is greater than a distance from the upper surface of the substrate to an upper surface of the second area.

In an exemplary embodiment of the present invention, the light emission layer is surrounded by the first electrode, the inorganic layer, and the second electrode.

In an exemplary embodiment of the present invention, an end of the light emission layer contacts an end of the inorganic layer.

In an exemplary embodiment of the present invention, the light emission layer has a thickness of about 2000 angstroms to about 4000 angstroms.

In an exemplary embodiment of the present invention, the inorganic layer has a thickness of about 50 angstroms to about 5000 angstroms.

According to an exemplary embodiment of the present invention, a display device includes: a first electrode; a second electrode overlapping the first electrode; a light emission layer disposed on the first electrode; a partition wall overlapping a portion of the first electrode; and an inorganic layer disposed between the partition wall and the first electrode, wherein the inorganic layer includes an opening overlapping the partition wall.

In an exemplary embodiment of the present invention, the light emission layer is surrounded by the first electrode, the inorganic layer, and the second electrode.

In an exemplary embodiment of the present invention, the light emission layer has a thickness of about 2000 angstroms to about 4000 angstroms.

In an exemplary embodiment of the present invention, the inorganic layer has a thickness of about 50 angstroms to about 5000 angstroms.

In an exemplary embodiment of the present invention, the inorganic layer includes at least one of a silicon oxide, a silicon oxynitride, or a silicon nitride.

In an exemplary embodiment of the present invention, the inorganic layer contacts a portion of the second electrode.

According to an exemplary embodiment of the present invention, a display device includes: a first electrode; a light emission layer disposed on the first electrode; a second electrode disposed on the light emission layer; a partition wall covering a portion of the first electrode; and an inorganic layer disposed between the first electrode and the partition wall, and between the second electrode and the first electrode.

In an exemplary embodiment of the present invention, the inorganic layer contacts the light emission layer.

In an exemplary embodiment of the present invention, the inorganic layer covers an upper surface of the first electrode and a side surface of the first electrode.

DETAILED DESCRIPTION OF THE EMBODIMENTS

Figure 1:
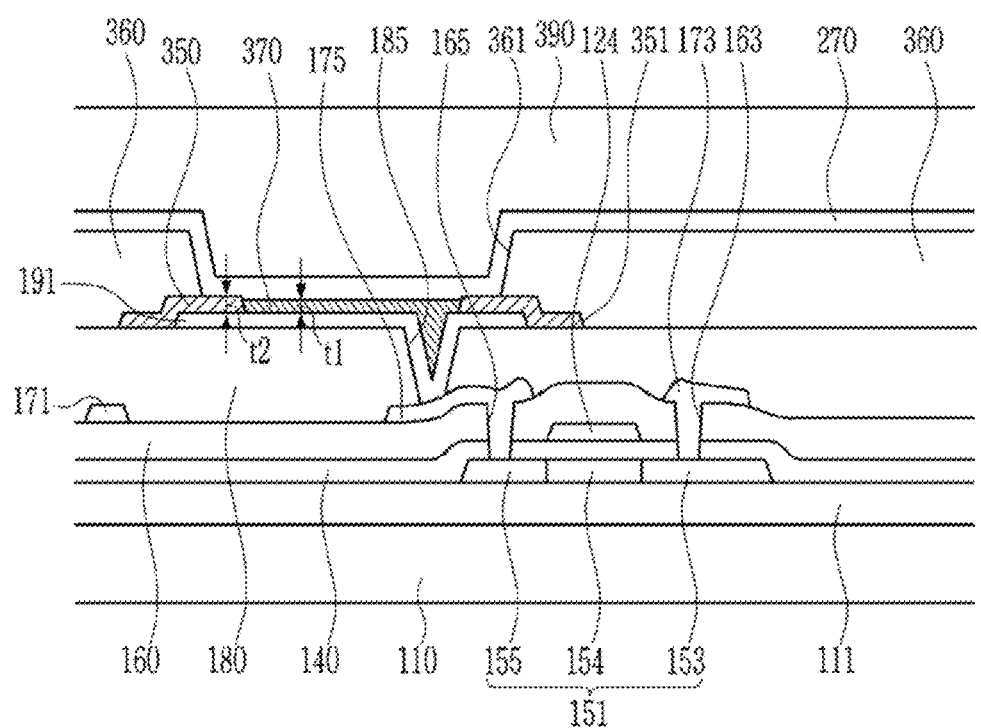
FIG. 1 illustrates a cross-sectional view of a display device according to an exemplary embodiment of the present invention.

The present invention will be described more fully hereinafter with reference to the accompanying drawings. It is to be understood that the described exemplary embodiments of the present invention may be modified in various different ways, without departing from the spirit or scope of the present disclosure.

In the drawings and the specification, like reference numerals may designate like elements, and thus, repetitive descriptions may be omitted.

Further, in the drawings, the size and thickness of each element may be exaggerated for clarity, and the present invention is not limited thereto.

It will be understood that when an element such as a layer, film, region, area, or substrate is referred to as being "on" another element, it can be directly on the other element or intervening elements may also be present. In addition, when an element is referred to as being "directly on" another element, there are no intervening elements present.

Further, throughout the specification, the phrase "in a plan view" may mean viewing a target portion from the top, and the phrase "in a cross-sectional view" may mean viewing a cross-section formed by vertically cutting a target portion from the side.

First, a display device according to an exemplary embodiment of the present invention will be described with reference to FIG. 1. FIG. 1 illustrates a cross-sectional view of a display device according to an exemplary embodiment of the present invention.

The display device according to the present embodiment includes a buffer layer 111 disposed on a substrate 110. The buffer layer 111 may overlap a surface of the substrate 110. For example, the buffer layer 111 may overlap the entire upper surface of the substrate 110. The buffer layer 111 may include an inorganic material such as a silicon oxide (SiOx), a silicon nitride (SiNx), and the like. The buffer layer 111 may be a single layer or a plurality of layers.

The buffer layer 111 may flatten one surface of the substrate 110, or it may prevent diffusion of impurities degrading characteristics of a semiconductor layer 151, which will be described later, and may prevent penetration of moisture and the like. In an exemplary embodiment of the present invention, the buffer layer 111 may be omitted.

The semiconductor layer 151 of a transistor is disposed on the buffer layer 111. The semiconductor layer 151 includes a channel region 154, and doped source and drain regions 153 and 155 disposed at respective sides of the channel region 154.

The semiconductor layer 151 may include, for example, polycrystalline silicon, amorphous silicon, or an oxide semiconductor.

A gate insulating layer 140 is disposed on the semiconductor layer 151. The gate insulating layer 140 may be disposed to overlap a surface of the substrate 110. For example, the gate insulating layer 140 may overlap the entire upper surface of the substrate 110.

The gate insulating layer 140 may include an inorganic insulating material such as a silicon oxide (SiOx), a silicon nitride (SiNx), and the like.

A gate conductor including a gate electrode 124 of a transistor is disposed on the gate insulating layer 140. The gate electrode 124 may overlap the channel region 154 of the semiconductor layer 151.

An interlayer insulating layer 160 including an inorganic insulating material or an organic insulating material is disposed on the gate electrode 124.

A data conductor including a source electrode 173 and a drain electrode 175 of a transistor, a data line 171, a driving voltage line, and the like, is disposed on the interlayer insulating layer 160. The source and drain electrodes 173 and 175 may be respectively connected to the source region 153 and the drain region 155 of the semiconductor layer 151 through contact holes 163 and 165 provided in the interlayer insulating layer 160 and the gate insulating layer 140.

The gate electrode 124, the source electrode 173, and the drain electrode 175 form a transistor together with the semiconductor layer 151. For example, the shown transistor may be a driving transistor included in one pixel of the display device. The shown transistor may be referred to as a top-gate transistor because the gate electrode 124 is disposed above the semiconductor layer 151. The structure of the transistor is not limited thereto, and may be variously changed. For example, the transistor may be a bottom-gate transistor in which the gate electrode is disposed under the semiconductor layer.

An insulating layer 180 is disposed on the interlayer insulating layer 160 and the data conductor. The insulating layer 180 may serve to eliminate or planarize a step to increase luminous efficiency of the light emitting diode to be formed thereon. The insulating layer 180 may overlap the transistor and cover the transistor.

The insulating layer 180 may include, for example, an organic insulating material. The organic insulating material may include, for example, polyimide, polyamide, polyacrylate, polyphenylene ether, polyphenylene sulfide, unsaturated polyester, an epoxy resin, a phenol resin, and the like, but the present invention is not limited thereto.

A first electrode 191, which may be a pixel electrode, is disposed on the insulating layer 180. The first electrode 191 may be connected to the drain electrode 175 of the transistor through a contact hole 185 provided in the insulating layer 180.

For example, the first electrode 191 may include a reflective conductive material, a semi-transmittable conductive material, or a transparent conductive material. For example, the first electrode 191 may include at least one of a transparent conductive material such as an indium tin oxide (ITO) or an indium zinc oxide (IZO), and a metal such as lithium (Li), calcium (Ca), aluminum (Al), silver (Ag), magnesium (Mg), and/or gold (Au). The first electrode 191 may include a structure in which a plurality of layers are stacked, and for example, the first electrode 191 may have a structure in which ITO/Ag/ITO is stacked.

A thickness t1 of the first electrode 191 may be about 500 angstroms (Å) to about 1500 angstroms.

A partition wall 360 is disposed on the insulating layer 180 and the first electrode 191. The partition wall 360 may overlap a portion of the first electrode 191. The partition wall 360 has an opening 361 overlapping a portion of the first electrode 191. The opening 361 of the partition wall 360 may provide an area corresponding to the pixel.

The partition wall 360 may include an organic insulating material such as polyimide, polyacrylate, and polyamide, but the present invention is not limited thereto.

An inorganic layer 350 is disposed between the partition wall 360 and the first electrode 191. The inorganic layer 350 may include any inorganic material, and for example, it may include at least one of a silicon oxide (SiOx), a silicon oxynitride (SiONx), and/or a silicon nitride (SiNx).

The inorganic layer 350 may cover an end of the first electrode 191. For example, the inorganic layer 350 may extend toward an end of the first electrode 191 while overlapping a portion of an upper surface of the first electrode 191 to cover a side surface of the end of the first electrode 191.

An end of the inorganic layer 350 may contact a light emission layer 370. For example, the end of the inorganic layer 350 is shown in contact with the light emission layer 370, but the present invention is not limited thereto, For example, the end of the inorganic layer 350 may have a structure covering an upper surface of an end of the light emission layer 370.

A portion of the inorganic layer 350 may overlap a second electrode 270. For example, the portion of the inorganic layer 350 may be disposed between the first electrode 191 and the second electrode 270, and may contact the first electrode 191 and the second electrode 270, respectively.

Another end of the inorganic layer 350 may overlap the partition wall 360. In this case, the inorganic layer 350 may include an opening 351 overlapping the partition wall 360.

The insulating layer 180 and the partition wall 360 may include an organic material, and the organic material may generate impurities when thermal energy and/or light energy are applied thereto. For example, the impurities may include at least one of O-based, OH-based, F-based, and/or S-based compounds, but the present invention is not limited thereto.

The impurities may not diffuse in a direction of the light emission layer 370 by the inorganic layer 350, but may diffuse in a direction of the partition wall 360 including the organic material. When the inorganic layer 350 does not include the opening 351, the impurities generated in the insulating layer 180 may be blocked by the first electrode 191 and the inorganic layer 350. In this case, a film may be lifted by impurities at an interface between the first electrode 191 and the insulating layer 180 and/or at an interface between the inorganic layer and the insulating layer 180. However, in the present embodiment, when the inorganic layer 350 includes the opening 351, the impurities may move in the direction of the partition wall 360 through the opening 351. Thus, the lifting of the film may be suppressed.

A thickness t2 of the inorganic layer 350 may be in a range of about 50 angstroms to about 5000 angstroms. When the thickness of the inorganic layer 350 is less than about 50 angstroms, it may be difficult to prevent the diffusion of impurities due to the relatively thin thickness thereof. When the thickness of the inorganic layer 350 is greater than about 5000 angstroms, a short circuit of the second electrode 270 deposited on the inorganic layer 350 may be caused.

The light emission layer 370 is disposed on the first electrode 191 and the inorganic layer 350. The light emission layer 370 includes a light emission area. The light emission layer 370 may additionally include at least one of a hole injection region, a hole transport region, an electron injection region, and/or an electron transport region.

The light emission layer 370 may include a material for intrinsically displaying light of primary colors such as red, green, and blue. In addition, a structure in which a plurality of organic material layers for emitting light of different colors are stacked may be provided. Moreover, an inorganic material for emitting light such as red, green, and blue light may be included therein.

The light emission layer 370 does not overlap the partition wall 360 in a plan view. The light emission layer 370 and the partition wall 360 may be disposed to be spaced apart from each other. An end of the light emission layer 370 may contact an end of the inorganic layer 350.

The second electrode 270 transmitting a common voltage is disposed on the light emission layer 370 and opposes the first electrode 191. The second electrode 270 may include a transparent conductive material such as an indium tin oxide (ITO) or an indium zinc oxide (IZO). The second electrode 270 may be formed to have light transmittance by stacking a metal such as calcium (Ca), barium (Ba), magnesium (Mg), aluminum (Al), and/or the like. At least one passivation layer or functional layer may be formed on the second electrode 270. The thickness of the second electrode 270 may be about 50 angstroms (Å) to about 200 angstroms.

The second electrode 270 may overlap the inorganic layer 350. For example, the second electrode 270 may contact the inorganic layer 350 exposed in a region in which the partition wall 360 and the light emission layer 370 are spaced apart from each other. For example, the second electrode 270 may contact a portion of the inorganic layer 350 that is not overlapped by the partition wall 360 and the light emission layer 370. When the inorganic layer 350 is not disposed, a problem that the second electrode 270 contacts the first electrode 191 may occur.

The first electrode 191, the light emission layer 370, and the second electrode 270 of each pixel form a light emitting element that is a light emitting diode. The first electrode 191 may be an anode, which is a hole injection electrode, and the second electrode 270 may be a cathode, which is an electron injection electrode. In addition, the first electrode 191 may be a cathode and the second electrode 270 may be an anode. Holes and electrons are injected into the light emission layer from the first electrode 191 and the second electrode 270, respectively, and light is emitted when excitons, in which the injected holes and electrons are combined, release energy as they enter a ground state from an excited state.

An encapsulation layer 390 may be disposed on the second electrode 270. The encapsulation layer 390 may have a structure in which a plurality of inorganic layers are included or an inorganic layer and an organic layer are alternately stacked. According to the present embodiment, the encapsulation layer 390 may include a multilayer structure in which an organic layer, an inorganic layer, and an organic layer are stacked.

The inorganic layer may include a metal oxide or a metal nitride. For example, the inorganic layer may include one of SiNx, $Al_2O_3$, $SiO_2$, and/or $TiO_2$. The organic layer may include a polymer, and may include, for example, one of polyethylene terephthalate, polyimide, polycarbonate, epoxy, polyethylene, and/or polyacrylate.

In the present embodiment the encapsulation layer 390 is disposed directly on the second electrode 270, but the present invention is not limited thereto, For example, a separate filling material, an adhesive material, or the like may be disposed between the second electrode 270 and the encapsulation layer 390.

The display device according to an exemplary embodiment of the present invention may include the light emission layer 370 surrounded by an inorganic material. Referring to FIG. 1, a lower surface of the light emission layer 370 may overlap the first electrode 191. A side surface of the light emission layer 370 may overlap the inorganic layer 350. In addition, an upper surface of the light emission layer 370 may overlap the second electrode 270. The light emission layer 370 according to the present embodiment may be surrounded by the first electrode 191, the inorganic layer 350, and the second electrode 270 including the inorganic material.

In a film including an organic material such as the insulating layer 180 and/or the partition wall 360, a gas may be generated during a manufacturing process or by sunlight, and this is called outgas. When the generated outgas flows into the light emission layer 370, a problem such as contamination or shrinkage of the light emission layer 370 may occur. Since the light emission layer 370 according to the present embodiment has a structure surrounded by an inorganic material, a gas generated from a film including an organic material may be prevented from entering. The contamination and shrinkage of the light emission layer 370 may be reduced, and reliability of the display device including the light emission layer 370 may be increased.

Figure 2:
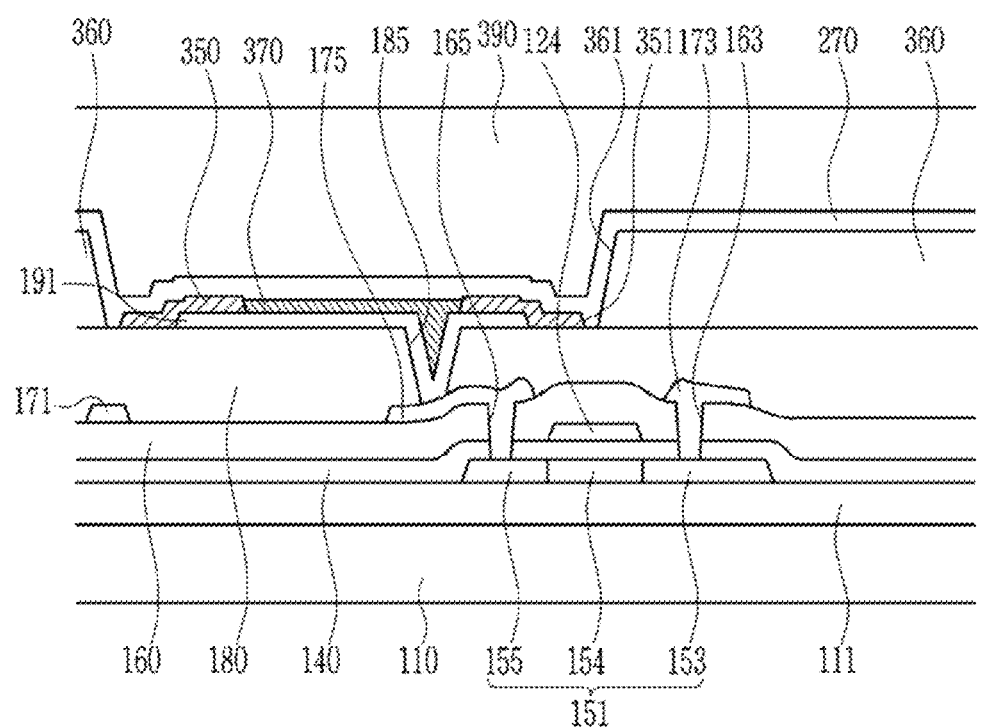
FIG. 2 illustrates a cross-sectional view of a display device according to an exemplary embodiment of the present invention.
Figure 3:
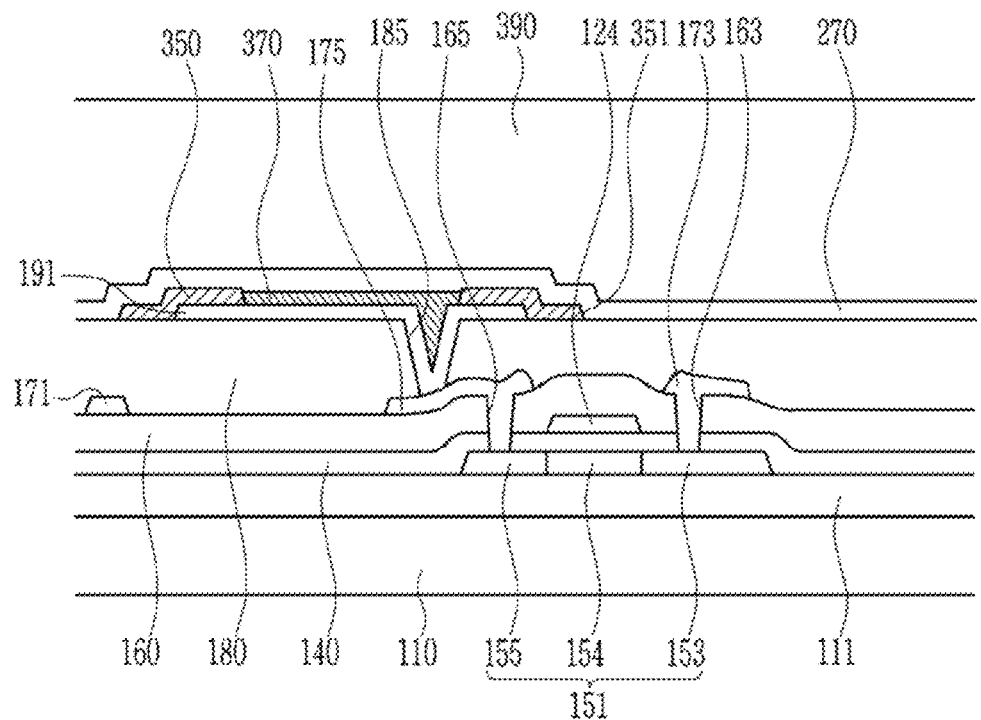
FIG. 3 illustrates a cross-sectional view of a display device according to an exemplary embodiment of the present invention.

Hereinafter, a display device according to an exemplary embodiment present invention will be described with reference to FIG. 2 and FIG. 3. FIG. 2 illustrates a cross-sectional view of a display device according to an exemplary embodiment of the present invention, and FIG. 3 illustrates a cross-sectional view of a display device according to an exemplary embodiment of the present invention. A description of the same or similar constituent elements as those of the embodiments described above may be omitted.

Referring to FIG. 2, the inorganic layer 350, according to an exemplary embodiment of the present invention, is disposed on the first electrode 191 and the insulating layer 180. The inorganic layer 350 may include any inorganic material, and for example, it may include at least one of a silicon oxide (SiOx), a silicon oxynitride (SiONx), and/or a silicon nitride (SiNx).

The inorganic layer 350 may cover an end of the first electrode 191. The inorganic layer 350 may overlap an edge of the first electrode 191. The first electrode 191 may be covered by the light emission layer 370 and the inorganic layer 350, and does not contact the second electrode 270.

An end of the inorganic layer 350 may contact the light emission layer 370. Herein, the end of the inorganic layer 350 is shown in contact with the light emission layer 370, but the present invention is not limited thereto. For example, the end of the inorganic layer 350 may have a structure covering the end of the light emission layer 370.

The inorganic layer 350 may overlap the second electrode 270. For example, all the inorganic layer 350 may overlap the second electrode 270, and some of the inorganic layer 350 may be disposed between the first electrode 191 and the second electrode 270. The inorganic layer 350 may contact the first electrode 191 and the second electrode 270, respectively.

The inorganic layer 350 may be spaced apart from the partition wall 360. The inorganic layer 350 may not overlap the partition wall 360. The inorganic layer 350 may include the opening 351 overlapping the partition wall 360.

The insulating layer 180 and the partition wall 360 may include an organic material, and the organic material may generate impurities when thermal energy and/or light energy are applied thereto. For example, the impurities may include at least one of O-based, OH-based, F-based, and S-based compounds, but the present invention not limited thereto.

The impurities may not diffuse in a direction of the light emission layer 370 by the inorganic layer 350, but may diffuse toward the partition wall 360 including the organic material. When the inorganic layer 350 does not include the opening 351 and overlaps the entire surface of the substrate 110, the impurities generated in the insulating layer 180 may be blocked by the first electrode 191 and the inorganic layer 350. In this case, a film may be lifted by impurities at an interface between the first electrode 191 and the insulating layer 180 and/or at an interface between the inorganic layer 350 and the insulating layer 180. However, in the present embodiment, when the inorganic layer 350 includes the opening 351, the impurities may move in the direction of the partition wall 360 through the opening 351; thus, the lifting of the film may be suppressed.

In an exemplary embodiment of the present invention, the partition wall 360 may be spaced apart from the light emission layer 370. In addition, the partition wall 360 may be spaced apart from the inorganic layer 350. The insulating layer 180 may be exposed in a spaced area between the partition wall 360 and the inorganic layer 350. In the spaced area, the insulating layer 180 may contact the second electrode 270.

According to the present embodiment, an upper surface of the light emission layer 370 is overlapped by the second electrode 270, side surfaces of the light emission layer 370 is overlapped by the inorganic layer 350, and a lower surface of the light emission layer 370 is overlapped by the first electrode 191. In other words, the light emission layer 370 is surrounded by the second electrode 270, the inorganic layer 350 and the first electrode 191. Since the light emission layer 370 is surrounded by the inorganic material, performance degradation due to penetration of an outgas such as impurities may be prevented.

Referring to FIG. 3, the display device according to an exemplary embodiment of the present invention may have a structure in which the partition wall 360 is removed from the display device of FIG. 1.

The first electrode 191 and the light emission layer 370 may be sequentially disposed on the insulating layer 180. The inorganic layer 350 may be disposed at a position overlapping an end of the first electrode 191. For example, the inorganic layer 350 may extend to cover a side surface of the end of the first electrode 191 while overlapping at least a portion of the upper surface of the first electrode 191. The inorganic layer 350 may contact the insulating layer 180 exposed by the first electrode 191.

An end of the inorganic layer 350 may contact the light emission layer 370. Herein, the end of the inorganic layer 350 is shown in contact with the light emission layer 370, but the present invention is not limited thereto, and the end of the inorganic layer 350 may have a structure covering an upper surface of the end of the light emission layer 370.

The inorganic layer 350 may overlap the second electrode 270. For example, all of the inorganic layer 350 may overlap the second electrode 270. For example, a portion of the inorganic layer 350 may be disposed between the first electrode 191 and the second electrode 270, and may contact the first electrode 191 and the second electrode 270, respectively.

The inorganic layer 350 may include the opening 351. The opening 351 may be formed between adjacent first electrodes 191, and may expose a portion of the insulating layer 180.

Unlike the embodiments described with reference to FIG. 1 and FIG. 2, the embodiment of FIG. 3 may not include the partition wall 360. The second electrode 270 may be disposed directly on the inorganic layer 350 and the light emission layer 370.

A spacer may be additionally disposed between the adjacent first electrodes.

According to the present embodiment, the second electrode 270 overlapping the first electrode 191 and the light emission layer 370 may have a step with respect to the second electrode 270 overlapping areas other than those. For example, the portion of the second electrode 270 overlapping the first electrode 191 and the light emission layer 370 may be higher than another portion of the second electrode 270 that is disposed on the insulating layers 180. For example, the first electrode 191 and some of the second electrode 270 overlapping the light emission layer 370 are referred to as a first area, and the remainder of the second electrode 270 is referred to as a second area. In this case, a linear distance from an upper surface of the second electrode 270 disposed in the first area to the substrate 110 may be greater than a linear distance from an upper surface of the second electrode 270 disposed in the second area to the substrate 110. The second electrode 270 overlapping the light emission layer 370 may be disposed higher than the second electrode 270 corresponding to an area other than that.

Figure 4:
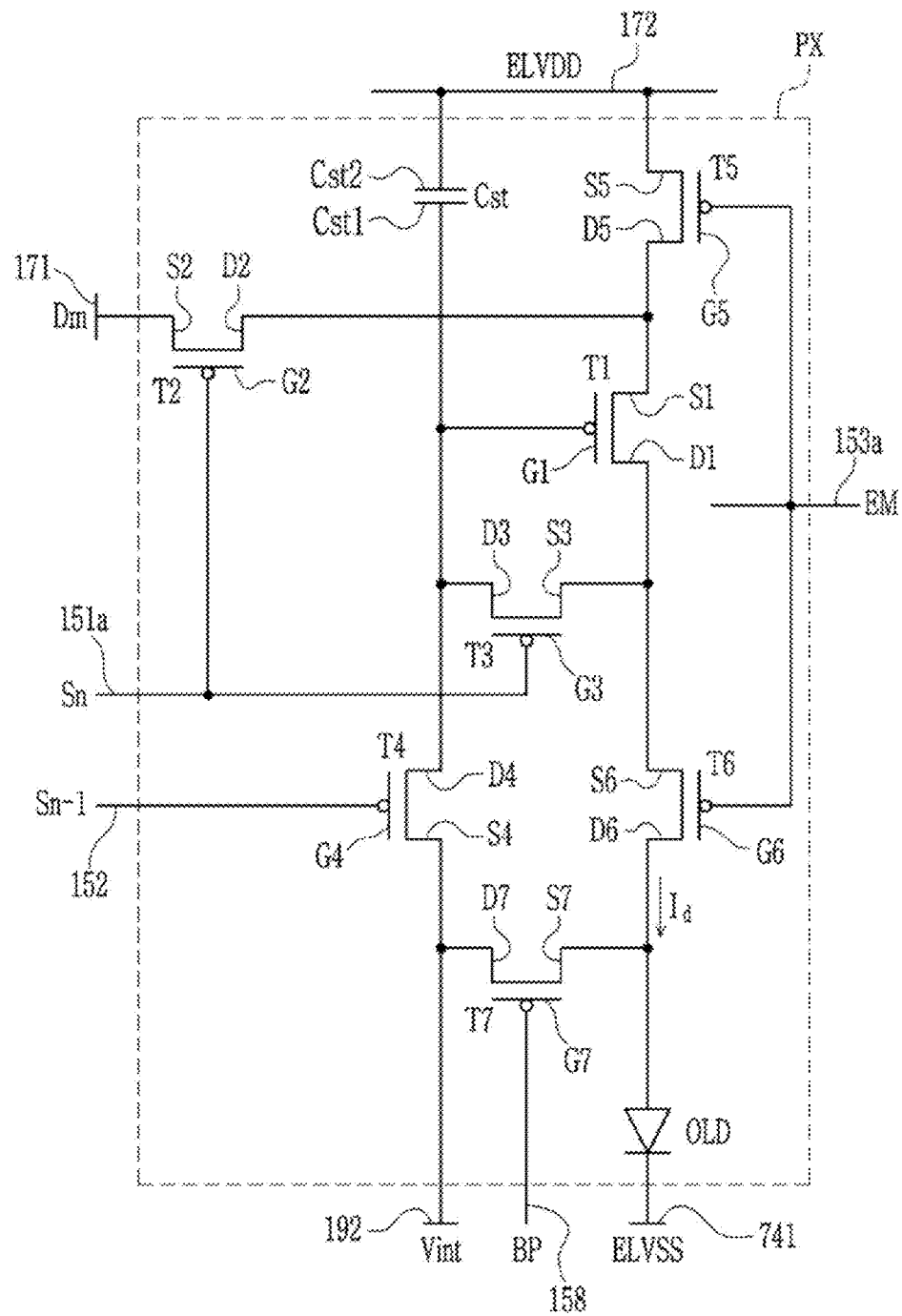
FIG. 4 illustrates an equivalent circuit diagram of one pixel of a display device according to an exemplary embodiment of the present invention.
Figure 5:
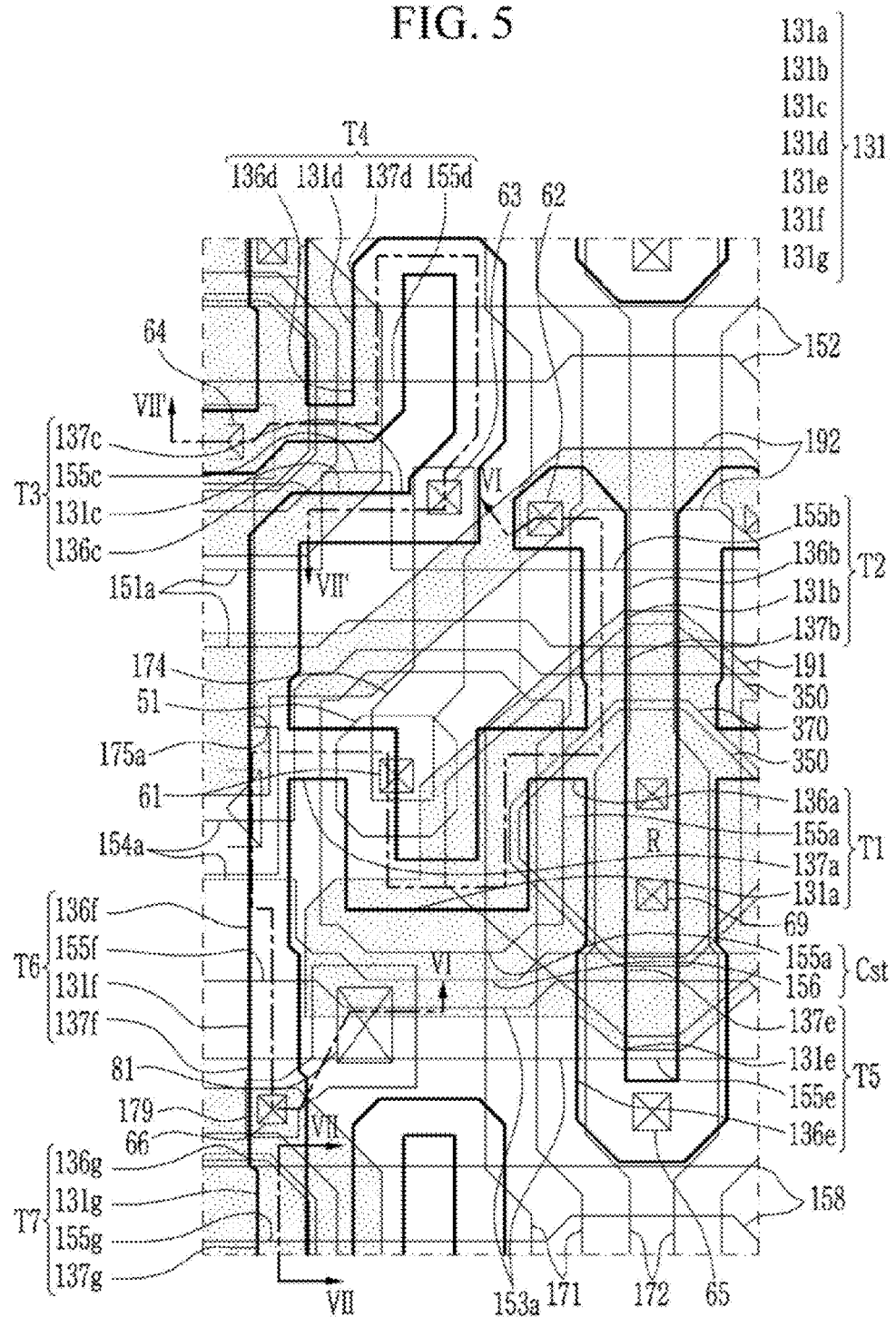
FIG. 5 illustrates a layout view of a transistors and a capacitor of a display device according to an exemplary embodiment of the present invention.
Figure 6:
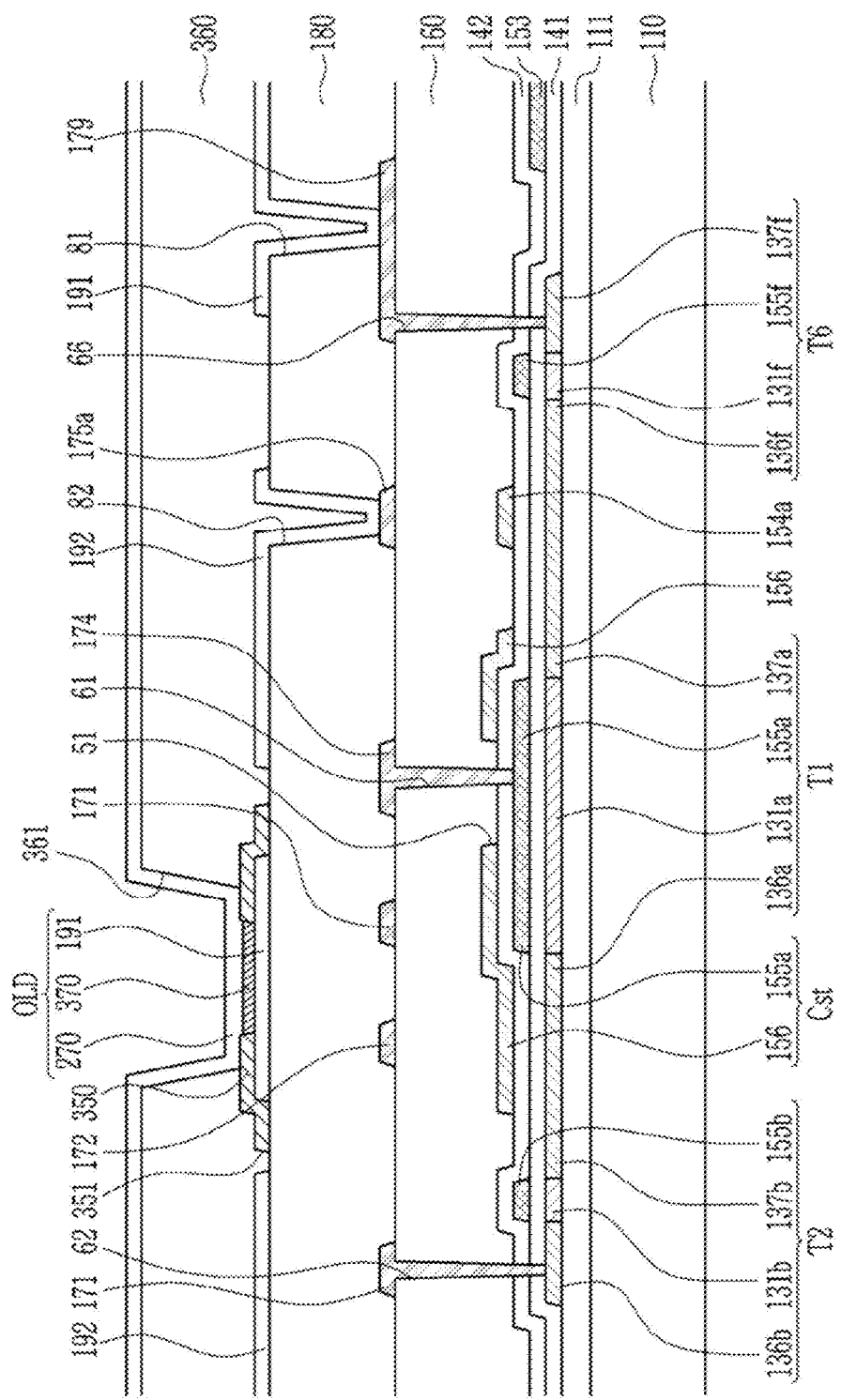
FIG. 6 illustrates a cross-sectional view taken along line VI-VI of the display device of FIG. 5.
Figure 7:
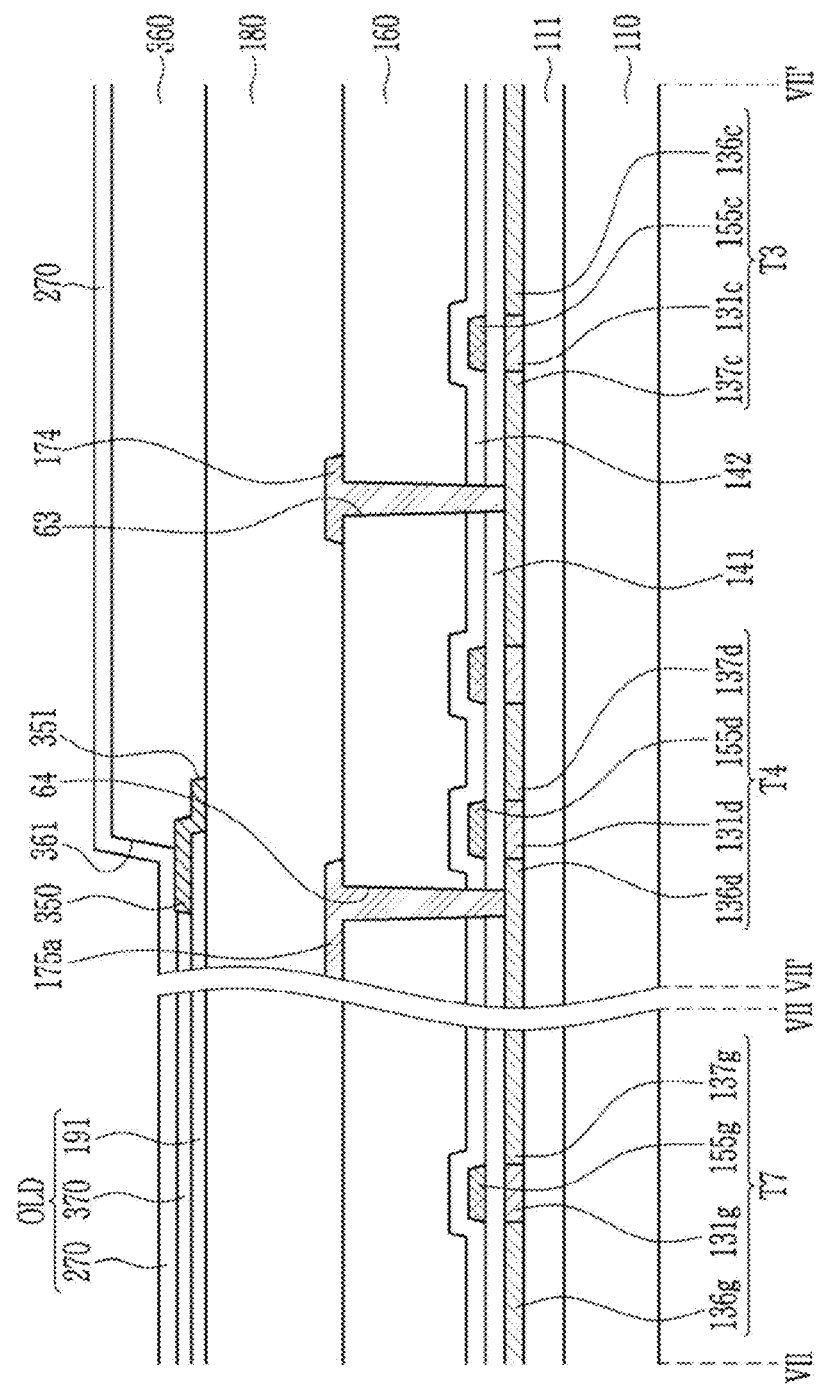
FIG. 7 illustrates a cross-sectional view taken along lines VII-VII and VII'-VII' of the display device of FIG. 5.

Hereinafter, a display device according to an exemplary embodiment of the present invention will be described with reference to FIG. 4 to FIG. 7. FIG. 4 illustrates an circuit diagram of one pixel of a display device according to an exemplary embodiment of the present invention, FIG. 5 illustrates a layout view of a transistors and a capacitor of a display device according to an exemplary embodiment of the present invention, FIG. 6 illustrates a cross-sectional view taken along line VI-VI of the display device of FIG. 5, and FIG. 7 illustrates a cross-sectional view taken along lines VII-VII and VII'-VII' of the display device of FIG. 5

As shown in FIG. 4, a display device according to the embodiment includes a plurality of signal lines (151a, 152, 153a, 158, 171, 172, and 192), and a plurality of pixels PX connected to the plurality of signal lines and substantially arranged in a matrix form.

One pixel PX of the light emitting diode display includes a plurality of transistors (T1, T2, T3, T4, T5, T6, and T7) connected to the plurality of signal lines (151a, 152, 153a, 158, 171, 172, and 192), a storage capacitor Cst, and a light emitting diode OLD.

The transistors (T1, T2, T3, T4, T5, T6, and T7) consist of a driving transistor T1, a switching transistor T2, a compensation transistor T3, an initialization transistor T4, an operation control transistor T5, a light emission control transistor T6, and a bypass transistor T7.

The signal lines (151a, 152, 153a, 158, 171, 172, and 192) includes a scan line 151a, a previous scan line 152, a light emission control line 153a, a bypass control line 158, a data line 171, a driving voltage line 172, and an initialization voltage line 192. The scan line 151a transmits a scan signal Sn. The previous scan line 152 transmits a previous scan signal Sn-1 to the initialization transistor T4. The light emission control line 153a transmits a light emission control signal EM to the operation control transistor T5 and the light emission control transistor T6. The bypass control line 158 transmits a bypass signal BP to the bypass transistor 17. The data line 171 crosses the scan line 151 and transmits a data signal Dm. The driving voltage line 172 transmits a driving voltage (ELVDD) and is formed substantially parallel to the data line 171. The initialization voltage line 192 transmits an initialization voltage Vint that initializes the driving transistor T1.

A gate electrode G1 of the driving transistor T1 is connected to one end (e.g., an electrode) Cst1 of the storage capacitor Cst. A source electrode S1 of the driving transistor T1 is connected to the driving voltage line 172 via the operation control transistor T5. A drain electrode D1 of the driving transistor T1 is electrically connected to an anode of the light emitting diode OLD via the light emission control transistor T6. The driving transistor T1 receives a data signal Dm in accordance with a switching operation of the switching transistor T2, and supplies a driving current Id to the light emitting diode OLD.

A gate electrode G2 of the switching transistor T2 is connected to the scan line 151a. A source electrode S2 of the switching transistor T2 is connected to the data line 171. A drain electrode D2 of the switching transistor T2 is connected to the source electrode S1 of the driving transistor T1 and is connected to the driving voltage line 172 via the operation control transistor T5. The switching transistor T2 is turned on in response to the scan signal Sn transmitted through the scan line 151a to perform a switching operation to transmit the data signal Dm, received through the data line 171, to the source electrode S1 of the driving transistor T.

A gate electrode G3 of the compensation transistor T3 is connected to the scan line 151a. A source electrode S3 of the compensation transistor T3 is connected to the drain electrode D1 of the driving transistor T1, and is simultaneously connected to an anode of the light emitting diode OLD via the light emission control transistor T6. A drain electrode D3 of the compensation transistor T3 is connected to the drain electrode D4 of the initialization transistor T4, one end Cst1 of the storage capacitor Cst, and the gate electrode G1 of the driving transistor T1. The compensation transistor T3 is turned on according to the scan signal Sn received through the scan line 151a to connect the gate electrode G1 and the drain electrode D1 of the driving transistor T1 to each other and to diode-connect the driving transistor T1.

A gate electrode G4 of the initialization transistor T4 is connected to the previous scan line 152. A source electrode S4 of the initialization transistor T4 is connected to the initialization voltage line 192. A drain electrode D4 of the initialization transistor T4 is connected to one end Cst1 of the storage capacitor Cst and the gate electrode G1 of the driving transistor T1 via the drain electrode D3 of the compensation transistor T3. The initialization transistor T4 is turned on according to the previous scan signal Sn-1 received through the previous scan line 152 to transmit the initialization voltage Vint to the gate electrode G1 of the driving transistor T1, and then initializes a gate voltage Vg of the gate electrode G1 of the driving transistor T1.

A gate electrode G5 of the operation control transistor T5 is connected to the light emission control line 153a. A source electrode S5 of the operation control transistor T5 is connected to the driving voltage line 172. A drain electrode D5 of the operation control transistor T5 is connected to the source electrode S1 of the driving transistor T1 and the drain electrode D2 of the switching transistor T2.

A gate electrode G6 of the light emission control transistor T6 is connected to a light emission control line 153a. A source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to an anode of the light emitting diode OLD.

The operation control transistor T5 and the light emission control transistor T6 are turned on at the same time according to the light emission control signal EM received through the light emission control line 153a. As a result, the driving voltage ELVDD is compensated through the diode-connected driving transistor T1 to be transmitted to the light emitting diode OLD.

A gate electrode G7 of the bypass transistor T7 is connected to the bypass control line 158. A source electrode S7 of the bypass transistor 17 is connected to the drain electrode D6 of the light emission control transistor T6 and the anode of the light emitting diode OLD. A drain electrode D7 of the bypass transistor 17 is connected to the initialization voltage line 192 and the source electrode S4 of the initialization transistor T4.

The other end Cst2 of the storage capacitor Cst is connected to the driving voltage line 172, and a cathode of the light emitting diode OLD is connected to a common voltage line 741 transmitting a common voltage ELVSS.

The configuration of seven transistors and one capacitor including the bypass transistor T7 has been described in the present specification, but the present invention is not limited thereto. For example, the number of transistors and the number of capacitors are modifiable in various ways.

Hereinafter, a planar structure of the display device according to the exemplary embodiment of the present invention will be described in detail with reference to FIG. 5 along with FIG. 4 described above.

The display device according to the present embodiment may apply the scan signal Sn, the previous scan signal Sn-1, the light emission control signal EM, and the bypass signal BP to the pixel, respectively, and the display device includes the scan line 151a, the previous scan line 152, the light emission control line 153a, and the bypass control line 158 that extend along a row direction. In addition, the data line 171 and the driving voltage line 172 that cross the scan line 151a, the previous scan line 152, the light emission control line 153a, and the bypass control line 158 and that apply the data signal Dm and the driving voltage ELVDD to the pixel, respectively, are included. The initialization voltage line 192 that transmits the initialization voltage Vint may have a shape of being bent a plurality of times along the row direction. The initialization voltage Vint transmitted from the initialization voltage line 192 may be transmitted to the compensation transistor T3 via the initialization transistor T4.

The pixel includes the driving transistor T1, the switching transistor T2, the compensation transistor T3, the initialization transistor T4, the operation control transistor T5, the light emission control transistor T6, the bypass transistor 17, the storage capacitor Cst, and the light emitting diode. The light emitting diode includes the first electrode 191, the light emission layer 370, and the second electrode 270.

Respective channels of the driving transistor T1, the switching transistor 12, the compensation transistor 13, the initialization transistor T4, the operation control transistor T5, the light emission control transistor T6, and the bypass transistor 17 are disposed in one semiconductor layer 131 connected thereto. The semiconductor layer 131 may have various curved shapes. For example, the semiconductor layer 131 may be patterned into separate portions. However, the present invention is not limited thereto.

The semiconductor layer 131 includes a channel doped with N-type or P-type impurities. In addition, the semiconductor layer 131 includes a source doped region and a drain doped region formed on opposite sides of the channel and having a higher doping concentration than that of the doped impurities doped in the channel. In the present embodiment, the source doped region and the drain doped region correspond to the source electrode and the drain electrode, respectively. The source electrode and the drain electrode formed on the semiconductor layer 131 may be formed by doping only corresponding regions of the semiconductor layer 131. In addition, a region between the source electrode and the drain electrode of different transistors in the semiconductor layer 131 may also be doped; thus, the source electrode and the drain electrode may be electrically connected.

The channel included in the semiconductor layer 131 may include a driving channel 131a included in the driving transistor T1, a switching channel 131b included in the switching transistor T2, a compensation channel 131c included in the compensation transistor T3, an initialization channel 131d included in the initialization transistor T4, an operation control channel 131e included in the transistor T5, a light emission control channel 131f included in the light emission control transistor T6, and a bypass channel 131g included in the bypass transistor T7.

The driving transistor T1 includes the driving channel 131a, a driving gate electrode 155a, a driving source electrode 136a, and a driving drain electrode 137a. The driving channel 131a is curved and may have a meandering shape or a zigzag shape. For example, the driving channel 131a may be bent a plurality of times. As an additional example, the driving channel 131 may have a "U" shape.

The driving gate electrode 155a overlaps the driving channel 131a. The driving source electrode 136a and the driving drain electrode 137a are disposed adjacent to respective sides of the driving channel 131a. The driving gate electrode 155a is connected to a driving connecting member 174 through a driving contact hole 61.

The switching transistor T2 includes the switching channel 131b, a switching gate electrode 155b, a switching source electrode 136b, and a switching drain electrode 137b. The switching gate electrode 155b, which is a portion extending downward from the scan line 151a, overlaps the switching channel 131b. The switching source electrode 136b and the switching drain electrode 137b are disposed adjacent to respective sides of the switching channel 131b. The switching source electrode 136b is connected to the data line 171 through a switching contact hole 62.

The compensation transistor T3 includes the compensation channel 131c, a compensation gate electrode 155c, a compensation source electrode 136c, and a compensation drain electrode 137c. The compensation gate electrode 155c may be a protrusion extending from the scan line 151a. For example, the compensation gate electrode 155c may extend upward from the scan line 151a. The compensation gate electrode 155c overlaps the compensation channel 131c. The compensation source electrode 136c and the compensation drain electrode 137c may be disposed at respective sides of the compensation channel 131c. The compensation drain electrode 137c is connected to the driving connecting member 174 through a compensation contact hole 63.

The initialization transistor T4 includes the initialization channel 131d, an initialization gate electrode 155d, an initialization source electrode 136d, and an initialization drain electrode 137d. The initialization gate electrode 155d may be a protrusion extending from the previous scan line 152. For example, the initialization gate electrode 155d may extend downward from the previous scan line 152. The initialization gate electrode 155d overlaps the initialization channel 131d. The initialization source electrode 136d and the initialization drain electrode 137d are disposed adjacent to respective sides of the initialization channel 131d. The initialization source electrode 136d is connected to an initialization connecting member 175a through an initialization contact hole 64.

The operation control transistor T5 includes the operation control channel 131e, an operation control gate electrode 155e, an operation control source electrode 136e, and an operation control drain electrode 137e. The operation control gate electrode 155e, which is a portion of the light emission control line 153a, overlaps the operation control channel 131e. The operation control source electrode 136e and the operation control drain electrode 137e are disposed adjacent to respective sides of the operation control channel 131e. The operation control source electrode 136e is connected to a portion of the driving voltage line 172 through an operation control contact hole 65.

The light emission control transistor T6 includes the light emission control channel 131f, a light emission control gate electrode 155f, a light emission control source electrode 136f, and a light emission control drain electrode 137f. The emission control gate electrode 155f, which is a portion of the light emission control line 153a, overlaps the emission control channel 131f. The light emission control source electrode 136f and the light emission control drain electrode 137f are disposed adjacent to respective sides of the light emission control channel 131f. The light emission control drain electrode 137f is connected to a light emission control connecting member 179 through a light emission control contact hole 66.

The bypass transistor T7 includes the bypass channel 131g, a bypass gate electrode 155g, a bypass source electrode 136g, and a bypass drain electrode 137g. The bypass gate electrode 155g, which is a portion of the bypass control line 158, overlaps the bypass channel 131g. The bypass source electrode 136g and the bypass drain electrode 137g are disposed adjacent to respective sides of the bypass channel 131g. The bypass source electrode 136g is connected to a light emission control connecting member 179 through the light emission control contact hole 66. The bypass drain electrode 137g is directly connected to the initialization source electrode 136d.

The driving source electrode 136a of the driving transistor T1 is connected to the switching drain electrode 137b and the operation control drain electrode 137e. The driving drain electrode 137a is connected to the compensation source electrode 136c and the light emission control source electrode 16.

The storage capacitor Cst includes a first storage electrode 155a and a second storage electrode 156 disposed with a second gate insulating layer 142 therebetween. The first storage electrode 155a corresponds to the driving gate electrode 155a. The second storage electrode 156 extends from a storage line 154a, occupies a larger area than the driving gate electrode 155a, and covers the driving gate electrode 155a. For example, the second storage electrode 156 entirely covers the driving gate electrode 155a. The second gate insulating layer 142 becomes a dielectric, and a storage capacitance is determined by a charge charged at the storage capacitor Cst and a voltage between the electrodes 155a and 156. By using the driving gate electrode 155a as the first storage electrode 155a, the storage capacitor may be formed in a space narrowed due to the driving channel 131a occupying a large area in the pixel.

The first storage electrode 155a, which is the driving gate electrode 155a, is connected to one end of the driving connecting member 174 through the driving contact hole 61 and a storage opening 51. The storage opening 51 is an opening formed in the second storage electrode 156.

The driving connecting member 174 and the data line 171 may be substantially parallel to each other and disposed on the same layer. The other end of the driving connecting member 174 is connected to the compensation drain electrode 137c of the compensation transistor T3 and the initialization drain electrode 137d of the initialization transistor T4 through the compensation contact hole 63. The driving connecting member 174 connects the driving gate electrode 155a, the compensation drain electrode 137c of the compensation transistor T3, and the initialization drain electrode 137d of the initialization transistor T4 to each other.

The second storage electrode 156 is connected to the driving voltage line 172 through a storage contact hole 69. The storage capacitor Cst may store a storage capacitance corresponding to a difference between the driving voltage ELVDD transmitted to the second storage electrode 156 through the driving voltage line 172 and the driving gate voltage of the driving gate electrode 155a.

Hereinafter, a cross-sectional structure of the display device according to the present embodiment will be described in detail according to the stacking order with reference to FIG. 6 and FIG. 7 along with FIG. 4 and FIG. 5. Since the operation control transistor T5 has a structure that is substantially the same as the stacked structure of the light emission control transistor T6, a detailed description thereof may be omitted.

The buffer layer 111 is disposed on the substrate 110. The buffer layer 111 may block impurities from the substrate 110 in a crystallization process of forming polycrystalline silicon. In addition, one surface of the substrate 110 may be planarized to reduce stress of the semiconductor layer disposed on the buffer layer 111. The buffer layer 111 may include an inorganic material such as a silicon nitride (SiNx) or a silicon oxide (SiOx).

A semiconductor layer including the driving channel 131a, the switching channel 131b, the compensation channel 131c, the initialization channel 131d, the operation control channel 131e, the emission control channel 131f, and the bypass channel 131g is disposed on the buffer layer 111.

The driving source electrode 136a and the driving drain electrode 137a are disposed at respective sides of the driving channel 131a. The switching source electrode 136b and the switching drain electrode 137b are disposed at respective sides of the switching channel 131b. The compensation source electrode 136c and the compensation drain electrodes 137c are disposed on respective sides of the compensation channel 131c. The initialization source electrode 136d and the initialization drain electrode 137d are disposed at respective sides of the initialization channel 131d. The operation control source electrode 136e and the operation control drain electrode 137e are disposed at respective sides of the operation control channel 131e. The emission control source electrode 136f and the emission control drain electrode 137f are disposed at respective sides of the emission control channel 131f. The bypass source electrode 136g and the bypass drain electrode 137g are disposed at respective sides of the bypass channel 131g.

A first gate insulating layer 141 is disposed on the semiconductor layer.

The scan line 151a including the switching gate electrode 155b and the compensation gate electrode 155c is disposed on the first gate insulating layer 141. In addition, the previous scan line 152 including the initialization gate electrode 155d is disposed on the first gate insulating layer 141. Further, the light emission control line 153a including the operation control gate electrode 155e and the light emission control gate electrode 155f is disposed on the first gate insulating layer 141. The bypass control line 158 including the bypass gate electrode 155g, and the first gate conductor including the driving gate electrode (and the first storage electrode) 155a are disposed on the first gate insulating layer 141.

The second gate insulating layer 142 is disposed on the first gate conductor and the first gate insulating layer 141. The first gate insulating layer 141 and the second gate insulating layer 142 may be, for example, a silicon nitride (SiNx), a silicon oxide (SiO$_2$), or the like.

A second gate conductor including the storage line 154a parallel to the scan line 151a and the second storage electrode 156 which is a portion extending from the storage line 154a is disposed on the second gate insulating layer 142.

The interlayer insulating layer 160 is disposed on the second gate insulating layer 142 and the second gate conductor. The interlayer insulating layer 160 may have the driving contact hole 61, the switching contact hole 62, the compensation contact hole 63, the initialization contact hole 64, the operation control contact hole 65, the light emission control contact hole 66, and the storage contact hole 69.

A data conductor including the data line 171, the driving voltage line 172, the driving connecting member 174, the initialization connecting member 175a, and the light emission control connecting member 179 is disposed on the interlayer insulating layer 160.

The data line 171 is connected to the switching source electrode 136b through the switching contact hole 62. One end of the driving connecting member 174 is connected to the first storage electrode 155a through the driving contact hole 61. The other end of the drive connecting member 174 is connected to the compensation drain electrode 137c and the initialization drain electrode 137d through the compensation contact hole 63. The initialization connecting member 175a is connected to the initialization source electrode 136d through the initialization contact hole 64. The light emission control connecting member 179 is connected to the light emission control drain electrode 137f through the light emission control contact hole 66.

The insulating layer 180 is disposed on the data conductor and the interlayer insulating layer 160. Since the insulating layer 180 covers the data conductor and substantially flattens one surface thereof, the first electrode 191 may be formed on the insulating layer 180 without a step. The insulating layer 180 may have a thicker thickness than the interlayer insulating layer 160, and may minimize parasitic capacitance between the data conductor and the first electrode 191.

The insulating layer 180 may include an organic material such as a polyacrylate resin and a polyimide resin, or a stacked film of an organic material and an inorganic material.

The first electrode 191 and the initialization voltage line 192 are disposed on the insulating layer 180. The light emission control connecting member 179 is connected to the first electrode 191 through a pixel contact hole 81. The initialization connecting member 175a is connected to the initialization voltage line 192 through an initialization voltage line contact hole 82.

The partition wall 360 is disposed on the first electrode 191. The partition wall 360 has the opening 361 exposing the first electrode 191.

The partition wall 360 may include an organic material such as a polyacrylate resin and a polyimide resin, or a silica-based inorganic material.

The light emission layer 370 may be disposed on the first electrode 191.

The inorganic layer 350 may be disposed between the partition wall 360 and the first electrode 191. Since the inorganic layer 350 according to the embodiment is the same as the inorganic layer 350 described with reference to FIG. 1, a detailed description thereof will be omitted.

The present embodiment to which the inorganic layer 350 according to the embodiment of FIG. 1 is applied is illustrated in the present specification, but the present invention is not limited thereto, and constituent elements for the first electrode 191, the inorganic layer 350, and the partition wall 360 described with reference to FIG. 2 and FIG. 3 may be applied thereto.

The second electrode 270 is disposed on the light emission layer 370. The second electrode 270 is also disposed on the partition wall 360 and is disposed across the plurality of pixels. The light emitting diode OLD including the first electrode 191, the light emission layer 370, and the second electrode 270 may be formed.

Here, the first electrode 191 may be an anode which is a hole injection electrode, and the second electrode 270 may be a cathode which is an electron injection electrode. However, the present embodiment is not limited thereto. For example, according to a driving method of the display device, the first electrode 191 may be a cathode and the second electrode 270 may be an anode. Holes and electrons are injected into the light emission layer 370 from the first electrode 191 and the second electrode 270, respectively, and excitons are generated by coupling the injected holes and electrons. As the exciton falls from an excited state to a ground state, light is emitted.

According to an exemplary embodiment of the present invention, since the light emission layer may include a structure surrounded by an inorganic material, it is possible to prevent performance degradation of the light emission layer due to penetration of outgas.

Figure 8:
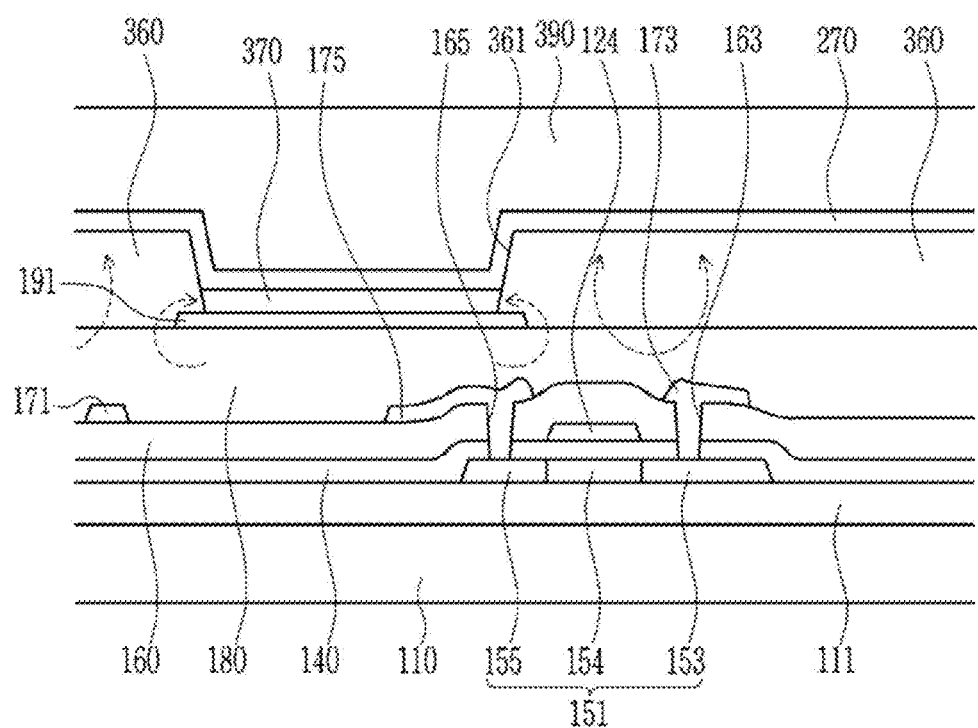
FIG. 8 illustrates a cross-sectional view of a display device according to a comparative example.
Figure 9A:
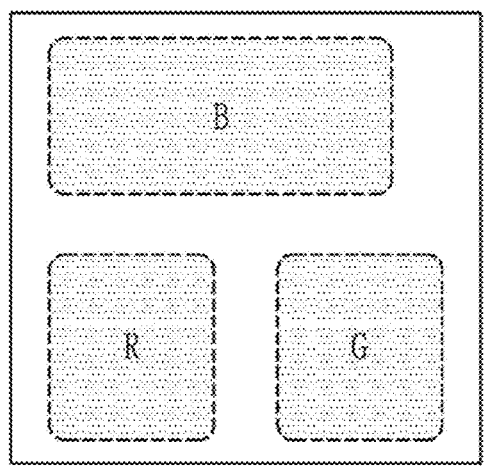
FIG. 9A illustrates a diagram of a light emission area according to an exemplary embodiment of the present invention.
Figure 9B:
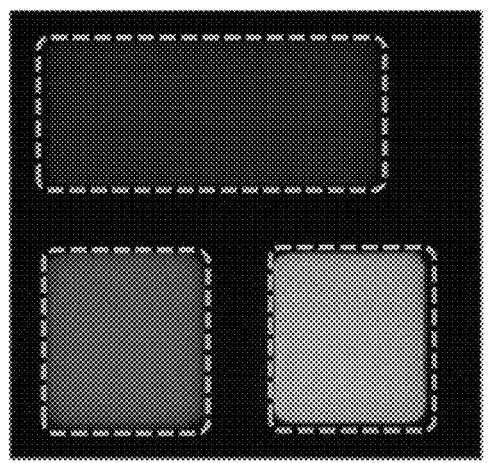
FIG. 9B illustrates an image of a light emission area according to an exemplary embodiment of the present invention.
Figure 10A:
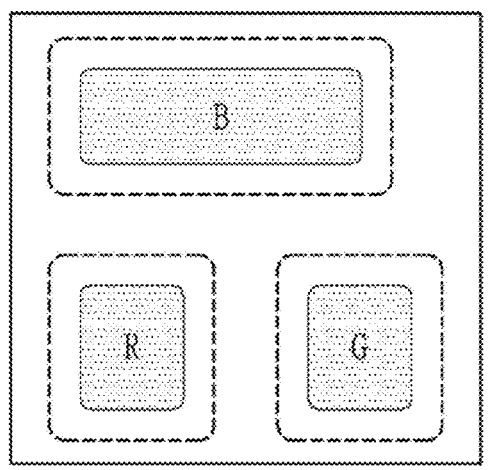
FIG. 10A illustrates a diagram of a light emission area according to a comparative example.
Figure 10B:
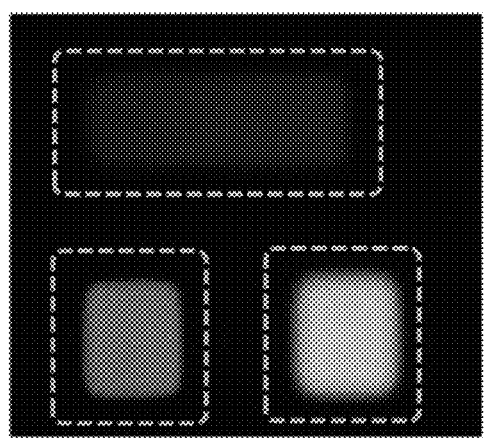
FIG. 10B illustrates an image of a light emission area according to a comparative example.
Figure 11:
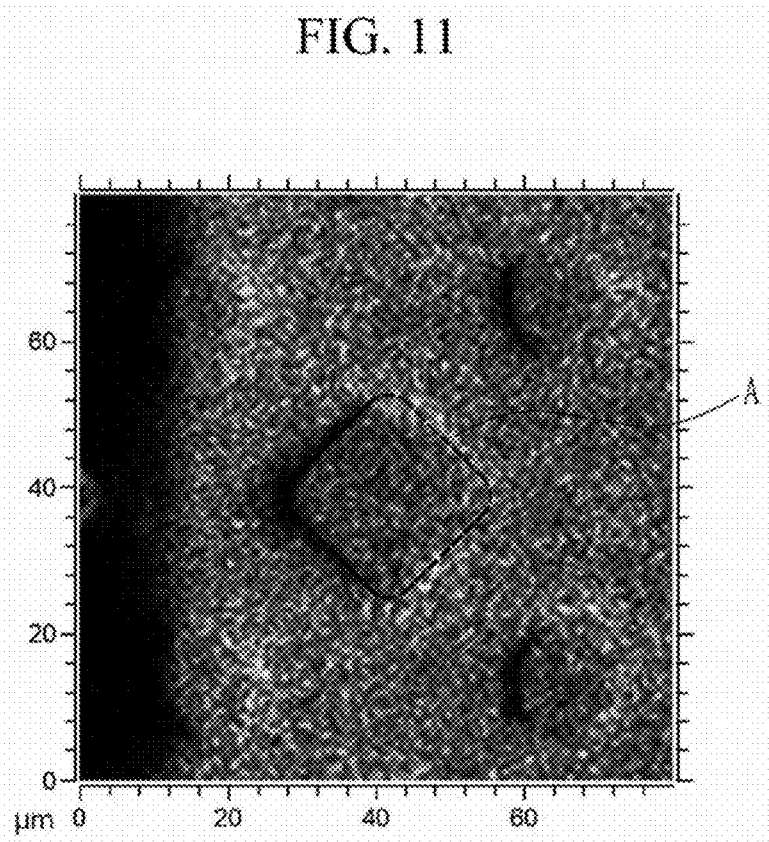
FIG. 11 illustrates an image of a light emission area according to an exemplary embodiment of the present invention.
Figure 12:
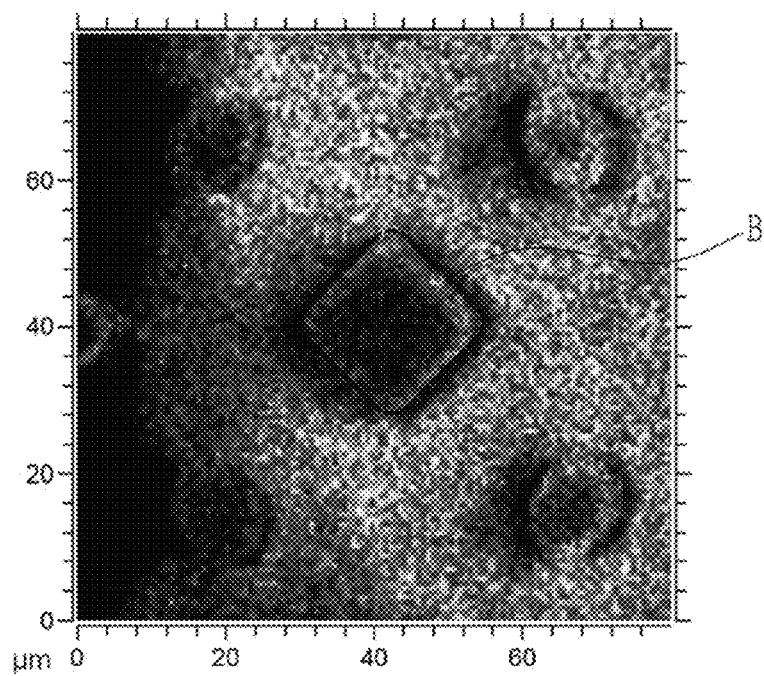
FIG. 12 illustrates an image of a light emission area according to a comparative example.

Hereinafter, display devices according to an exemplary embodiment of the present invention and a comparative example will be described with reference to FIG. 8 to FIG. 12. FIG. 8 illustrates a cross-sectional view of a display device according to a comparative example. FIG. 9A illustrates a diagram of a light emission area according to an exemplary embodiment of the present invention. FIG. 9B illustrates an image of a light emission area according to an exemplary embodiment of the present invention. FIG. 10A illustrates a diagram of a light emission area according to a comparative example. FIG. 10B illustrates an image of a light emission area according to a comparative example. FIG. 11 illustrates an image of a light emission area according to an exemplary embodiment of the present invention. FIG. 12 illustrates an image of a light emission area according to a comparative example. The light emission area referred to herein is a light emission area formed by the light emission layer.

First, referring to FIG. 8, the display device according to the comparative example does not include an inorganic layer, and thus, the light emission layer 370 may have difficulty in blocking penetration of external impurities. For example, when heat or/and light energy is applied to the display device, impurities may be generated from the insulating layer 180, the partition wall 360, and the like, and the generated impurities may diffuse (in FIG. 8, a schematic form in which the impurities diffuse is shown with dotted lines). The impurities diffuse and are adsorbed toward and to an interface between the second electrode 270 and the light emission layer 370 to cause shrinkage of the light emission layer 370. Therefore, a light emission area of the display device may be reduced, and luminance thereof may be reduced. Thus, quality of the display device may be degraded.

Referring to FIG. 9A and FIG. 9B, it can be seen that the light is emitted in the light emission areas indicated by the dotted lines according to an exemplary embodiment of the present inventive concept. In contrast, referring to FIG. 10A and FIG. 10B, it can be seen that the light emission layer according to the comparative example is contracted to emit light in a reduced area compared to a light emission area (indicated by the dotted line which correspond to the light emission areas in FIGS. 9A and 9B) designed in an actual manufacturing process.

In addition, referring to FIG. 11 according to an exemplary embodiment of the present invention, a mapping image with respect to a specific element (for example, oxygen in one light emission area) is illustrated. FIG. 12 illustrates a mapping image with respect to a specific element (for example, oxygen) in one light emission area according to a comparative example. Comparing FIG. 11 and FIG. 12, it can be seen that a large amount of oxygen (O) displayed in black near an edge (B) is detected in the light emission layer of the comparative example according to FIG. 12. This indicates that a large amount of impurities released from the insulating layer and the partition wall are adsorbed into the edge of the light emission layer. As a result, the shrinkage of the light emission layer may occur as described above. However, in a case of FIG. 11 according to the present embodiment, it can be seen that the oxygen displayed in black near the edge (B) of the light emission layer is hardly detected, and thus the fact that it is possible to prevent impurities from being absorbed into the light emission layer is confirmed.

According to the present embodiment, the light emission layer may be surrounded by the first electrode, the inorganic layer, and the second electrode, thereby reducing shrinkage due to impurities generated by thermal energy and/or light energy. It is therefore possible to provide a display device having an increased light emission area and display quality.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a first electrode;
a second electrode overlapping the first electrode;
a light emission layer disposed between the first electrode and the second electrode;
a partition wall overlapping a portion of the first electrode; and
an inorganic layer disposed between the partition wall and the first electrode,
wherein the inorganic layer covers an end of the first electrode,
wherein an upper surface of the inorganic layer is higher than an upper surface of the light emission layer in a direction substantially perpendicular to an upper surface of the first electrode.

2. The display device of claim 1, wherein
the light emission layer is surrounded by the first electrode, the inorganic layer, and the second electrode.

3. The display device of claim 1, wherein
a side surface of the light emission layer contacts a side surface of the inorganic layer.

4. The display device of claim 1, wherein
the light emission layer has a thickness of about 2000 angstroms to about 4000 angstroms.

5. The display device of claim 1, wherein
the inorganic layer has a thickness of about 50 angstroms to about 5000 angstroms.

6. The display device of claim 1, wherein
the inorganic layer includes at least one of a silicon oxide, a silicon oxynitride, or a silicon nitride.

7. The display device of claim 1, wherein
the inorganic layer is in contact with the second electrode.

8. The display device of claim 1, further comprising:
a transistor disposed on a substrate; and
an insulating layer disposed on the transistor,
wherein the second electrode is in contact with the insulating layer.

9. A display device comprising:
a transistor disposed on a substrate;
an insulating layer disposed on the transistor;
a first electrode disposed on the insulating layer and electrically connected to the transistor;
a second electrode overlapping the first electrode;
a light emission layer disposed between the first electrode and the second electrode; and
an inorganic layer disposed between the first electrode and the second electrode,
wherein the inorganic layer contacts the light emission layer and covers an end of the first electrode,
wherein the light emission layer is surrounded by the first electrode, the inorganic layer, and the second electrode.

10. The display device of claim 9, wherein
the second electrode includes a first area overlapping the first electrode and a second area corresponding to a remaining portion, and
a distance from an upper surface of the substrate to an upper surface of the first area of the second electrode is greater than a distance from the upper surface of the substrate to an upper surface of the second area.

11. The display device of claim 9, wherein
an end of the light emission layer contacts an end of the inorganic layer.

12. The display device of claim 9, wherein
the light emission layer has a thickness of about 2000 angstroms to about 4000 angstroms.

13. The display device of claim 9, wherein
the inorganic layer has a thickness of about 50 angstroms to about 5000 angstroms.

14. A display device comprising:
a first electrode;

a second electrode overlapping the first electrode;
a light emission layer disposed on the first electrode;
a partition wall overlapping a portion of the first electrode; and
an inorganic layer disposed between the partition wall and the first electrode,
wherein the inorganic layer includes an opening overlapping the partition wall.

15. The display device of claim 14, wherein
the light emission layer is surrounded by the first electrode, the inorganic layer, and the second electrode.

16. The display device of claim 14, wherein
the light emission layer has a thickness of about 2000 angstroms to about 4000 angstroms.

17. The display device of claim 14, wherein
the inorganic layer has a thickness of about 50 angstroms to about 5000 angstroms.

18. The display device of claim 14, wherein
the inorganic layer includes at least one of a silicon oxide, a silicon oxynitride, or a silicon nitride.

19. The display device of claim 14, wherein
the inorganic layer contacts a portion of the second electrode.

* * * * *